(12) United States Patent
Kawashima et al.

(10) Patent No.: US 11,721,889 B2
(45) Date of Patent: Aug. 8, 2023

(54) ELECTROMAGNETIC WAVE TRANSMISSIVE COVER AND METHOD FOR MANUFACTURING THE SAME

(71) Applicant: NISSHA CO., LTD., Kyoto (JP)

(72) Inventors: Eiji Kawashima, Kyoto (JP); Hiroyuki Konishi, Kyoto (JP); Yasuhide Fukada, Kyoto (JP); Toshitsugu Fujimura, Kyoto (JP); Toru Okada, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 344 days.

(21) Appl. No.: 16/973,983

(22) PCT Filed: Apr. 22, 2019

(86) PCT No.: PCT/JP2019/016997
§ 371 (c)(1),
(2) Date: Dec. 10, 2020

(87) PCT Pub. No.: WO2020/003710
PCT Pub. Date: Jan. 2, 2020

(65) Prior Publication Data
US 2021/0159592 A1  May 27, 2021

(30) Foreign Application Priority Data

Jun. 26, 2018 (JP) .................. 2018-120829

(51) Int. Cl.
*H01Q 1/42* (2006.01)
*B60R 13/00* (2006.01)
(Continued)

(52) U.S. Cl.
CPC ............ *H01Q 1/425* (2013.01); *B60R 13/005* (2013.01); *G01S 7/03* (2013.01); *G01S 7/40* (2013.01);
(Continued)

(58) Field of Classification Search
CPC ............ H01Q 1/02; H01Q 1/42; H01Q 1/422; H01Q 1/425; B60R 13/005; G01S 7/03;
(Continued)

(56) References Cited

U.S. PATENT DOCUMENTS 7,326,894 B2 * 2/2008 Meiler .................. H05B 3/267
219/704
7,990,334 B2 * 8/2011 Maeda .................. H01Q 1/44
343/711
(Continued)

FOREIGN PATENT DOCUMENTS

DE 102014002438 A1 * 8/2015 ........... G01S 13/931
DE 102014214329 A1 1/2016
(Continued)

OTHER PUBLICATIONS

International Search Report dated Jul. 23, 2019 issued in corresponding PCT/JP2019/016997 application (1 page).
English Abstract of JP 2017-215242 A published Dec. 7, 2017.

*Primary Examiner* — Peter M Bythrow
(74) *Attorney, Agent, or Firm* — Millen, White, Zelano & Branigan, P.C.; William Nixon

(57) ABSTRACT

Object:
A plurality of problems of an electromagnetic wave transmissive cover to be installed in an electromagnetic wave irradiation direction of a sensor using an electromagnetic wave are simultaneously eliminated.
Resolution means:
An electromagnetic wave transmissive cover 1 is a member to be installed in an electromagnetic wave irradiation direction of a millimeter wave radar 100 using an electromagnetic wave, and includes a colored resin member 3, a transparent resin member 5, and a transparent heater film 7. The transparent resin member 5 is provided on an opposite side to the millimeter wave radar 100 of the colored resin
(Continued)

member 3. The transparent heater film 7 is provided on the opposite side to the millimeter wave radar 100 of the colored resin member 3, includes a wiring pattern formed by copper plating or etching, and has electromagnetic wave transmissivity.

20 Claims, 9 Drawing Sheets

(51) Int. Cl.

| | | |
|---|---|---|
| *G01S 7/03* | (2006.01) | |
| *G01S 7/40* | (2006.01) | |
| *G01S 13/931* | (2020.01) | |
| *H05K 3/00* | (2006.01) | |
| *H05K 3/06* | (2006.01) | |
| *B29C 45/16* | (2006.01) | |
| *B29K 33/00* | (2006.01) | |
| *B29K 69/00* | (2006.01) | |
| *B29L 31/30* | (2006.01) | |

(52) U.S. Cl.
CPC .......... *G01S 13/931* (2013.01); *H05K 3/0002* (2013.01); *H05K 3/0014* (2013.01); *H05K 3/06* (2013.01); *B29C 45/16* (2013.01); *B29K 2033/12* (2013.01); *B29K 2069/00* (2013.01); *B29K 2995/002* (2013.01); *B29K 2995/0026* (2013.01); *B29L 2031/3005* (2013.01); *G01S 7/4047* (2021.05); *H05K 2203/1305* (2013.01)

(58) Field of Classification Search
CPC ........ G01S 7/40; G01S 13/931; G01S 7/4047; H05K 3/0002; H05K 3/0014; H05K 3/06; H05K 2203/1305; B29C 45/16; B29K 2995/002; B29L 2031/3005
See application file for complete search history.

(56) References Cited

U.S. PATENT DOCUMENTS

| | | | |
|---|---|---|---|
| 10,651,530 B2* | 5/2020 | Okumura | H01Q 1/44 |
| 11,005,151 B2* | 5/2021 | Mascaró Hereza | H01Q 1/425 |
| 11,005,172 B2* | 5/2021 | Nicke | H05K 1/0212 |
| 11,462,824 B2* | 10/2022 | Goetzelmann | H01Q 1/3233 |
| 2002/0011946 A1* | 1/2002 | Artis | H01Q 1/44 |
| | | | 342/13 |
| 2002/0044101 A1* | 4/2002 | Zimmermann | H01Q 1/02 |
| | | | 343/872 |
| 2002/0171579 A1* | 11/2002 | Artis | H01Q 1/425 |
| | | | 342/13 |
| 2003/0052810 A1* | 3/2003 | Artis | H01Q 1/44 |
| | | | 343/872 |
| 2005/0285773 A1* | 12/2005 | Hartzstein | H01Q 1/3233 |
| | | | 342/107 |
| 2015/0086731 A1* | 3/2015 | Sugiura | B32B 37/18 |
| | | | 156/196 |
| 2015/0140259 A1* | 5/2015 | Sugiura | B32B 27/34 |
| | | | 428/161 |
| 2016/0111776 A1* | 4/2016 | Okumura | H01Q 1/422 |
| | | | 343/872 |
| 2017/0352938 A1* | 12/2017 | Okumura | H01Q 1/425 |
| 2018/0067003 A1* | 3/2018 | Michiwaki | G01L 5/243 |
| 2018/0170314 A1* | 6/2018 | Paule | G01S 7/4004 |
| 2018/0254551 A1* | 9/2018 | Guretzky | B60R 13/005 |
| 2018/0269569 A1* | 9/2018 | Nicke | H05K 1/028 |
| 2018/0287252 A1* | 10/2018 | Nicke | H05K 1/028 |
| 2019/0232886 A1* | 8/2019 | Okumura | H01Q 1/422 |
| 2019/0293752 A1* | 9/2019 | Ochiai | G01S 13/93 |
| 2019/0322224 A1 | 10/2019 | Okumura et al. | |
| 2021/0384622 A1* | 12/2021 | Caruso | H01Q 1/422 |

FOREIGN PATENT DOCUMENTS

| | | |
|---|---|---|
| JP | 2017-215242 A | 12/2017 |
| WO | 2016/159245 A1 | 10/2016 |
| WO | 2018/074118 A1 | 4/2018 |

* cited by examiner

ELECTROMAGNETIC WAVE TRANSMISSIVE COVER AND METHOD FOR MANUFACTURING THE SAME

CROSS REFERENCES TO RELATED APPLICATIONS

This application is a continuation of International Application No. PCT/JP2019/016997, filed on Apr. 22, 2019, which claims priority to Japanese Patent Application 2018-120829, filed on Jun. 26, 2018, which is incorporated herein by reference.

TECHNICAL FIELD

The present disclosure relates to an electromagnetic wave transmissive cover and a method for manufacturing the same, and particularly relates to an electromagnetic wave transmissive cover to be installed in an electromagnetic wave irradiation direction of a sensor using an electromagnetic wave, and a method for manufacturing the same.

BACKGROUND

A radio wave radar is used, for example, as a sensor to be used for self-driving of a vehicle. The radio wave radar transmits a microwave having a frequency of 300 MHz to 300 GHz, and receives the radio wave reflected by hitting an object, thereby measuring an inter-vehicle distance and a relative velocity between the vehicle and a preceding vehicle from a difference between the transmission wave and the reception wave.

A radio wave radar using a millimeter wave having a frequency of 30 GHz to 300 GHz among microwaves is easily miniaturized. Therefore, millimeter wave radars are commonly used as on-board radars.

The millimeter wave radar is covered by a radar wave transmissive radar device cover (see, for example, Patent Literature 1).

CITATION LIST

Patent Literature

Patent Literature 1: JP 2007-93241 A

SUMMARY

Problems to be Solved by the Present Disclosure

For example, a millimeter wave radar is arranged behind an emblem in some cases. In such cases, there are a plurality of problems to be described below.

A metal glitter surface of the emblem may prevent transmission of an electromagnetic wave.

When adhesion of snow and ice to the emblem occurs, there is a possibility that a communication failure or observation distance reduction may occur.

An object of the present disclosure is to simultaneously solve a plurality of problems of an electromagnetic wave transmissive cover to be installed in an electromagnetic wave irradiation direction of a sensor using an electromagnetic wave.

Features for Solving the Problems

Some aspects will be described below as means to solve the problems. These aspects can be combined optionally, as needed.

An electromagnetic wave transmissive cover according to a perspective of the present disclosure is an electromagnetic wave transmissive cover to be installed in an electromagnetic wave irradiation direction of a sensor using an electromagnetic wave, the electromagnetic wave transmissive cover includes a colored resin member, a transparent resin member, and a transparent heater film.

The transparent resin member is provided on a side opposite to a sensor of the colored resin member.

The transparent heater film is provided on the side opposite to the sensor of the colored resin member and has electromagnetic wave transmissivity. The transparent heater film has a wiring pattern formed by copper plating or copper foil etching.

With this electromagnetic wave transmissive cover, since the colored resin member can be viewed through the transparent heater film and the transparent resin member, a deep design can be implemented. Furthermore, snow and ice adhering to a surface thereof can be rapidly melted by the transparent heater film.

Since a wiring pattern of the transparent heater film is formed by the copper plating or the copper foil etching, the accuracy of a copper wiring thickness is improved.

The electromagnetic wave transmissive cover may further include a pictorial pattern layer. The pictorial pattern layer is arranged between the colored resin member and the transparent resin member. The transparent heater film is provided on a surface opposite to the colored resin member of the transparent resin member.

In this electromagnetic wave transmissive cover, a metal-like pattern or other patterns can be implemented by the pictorial pattern layer.

The transparent heater film may be provided between the transparent resin member and the colored resin member.

The electromagnetic wave transmissive cover may be an emblem to be mounted on a vehicle. The sensor may be a millimeter wave radar.

With this electromagnetic wave transmissive cover, the emblem is available in cold regions, and a deeper design can be implemented. Note that an emblem is one of components for a vehicle, and displays a logo and a brand.

A method according to another perspective of the present disclosure is a method for manufacturing an electromagnetic wave transmissive cover to be installed in an electromagnetic wave irradiation direction of a sensor using an electromagnetic wave, the method includes the following processes.

A process of molding a colored resin member

A process of molding a transparent resin member on one surface of the colored resin member, and integrally molding a transparent heater film having electromagnetic wave transmissivity with the transparent resin member A wiring pattern of the transparent heater film is formed by copper plating or copper foil etching.

In this method, the molding of the transparent resin member is performed after the molding of the colored resin member, and the transparent heater film is integrally molded with the transparent resin member. Therefore, it becomes unnecessary to manage an FPC of the transparent heater film during the molding of the colored resin member, which makes the manufacturing process easier.

Since the wiring pattern of the transparent heater film is formed by the copper plating or the copper foil etching, the accuracy of a copper wiring thickness is improved.

Advantageous Effects of Disclosure

An electromagnetic wave transparent cover to be installed in an electromagnetic wave irradiation direction of a sensor using an electromagnetic wave according to the present disclosure can be used in cold regions, and makes it possible to implement a deeper design.

DETAILED DESCRIPTION

1. First Embodiment (1) Basic Configuration

Figure 1:
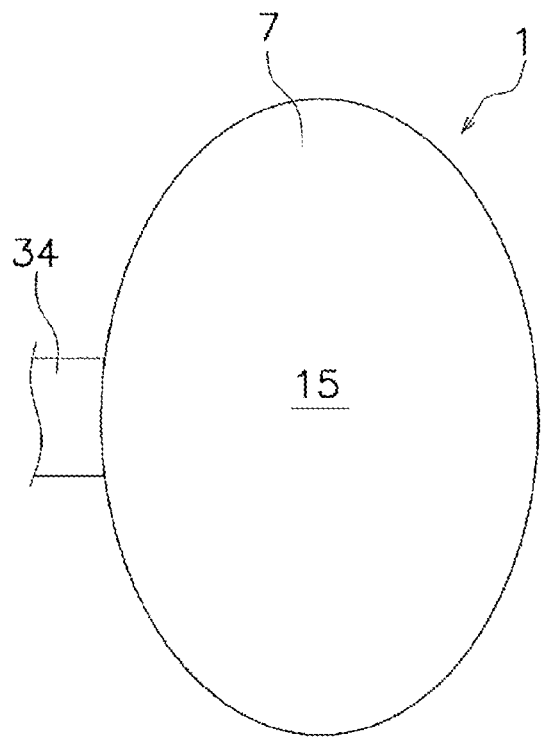
FIG. 1 is a schematic plan view of an electromagnetic wave transmissive cover according to a first embodiment.
Figure 2:
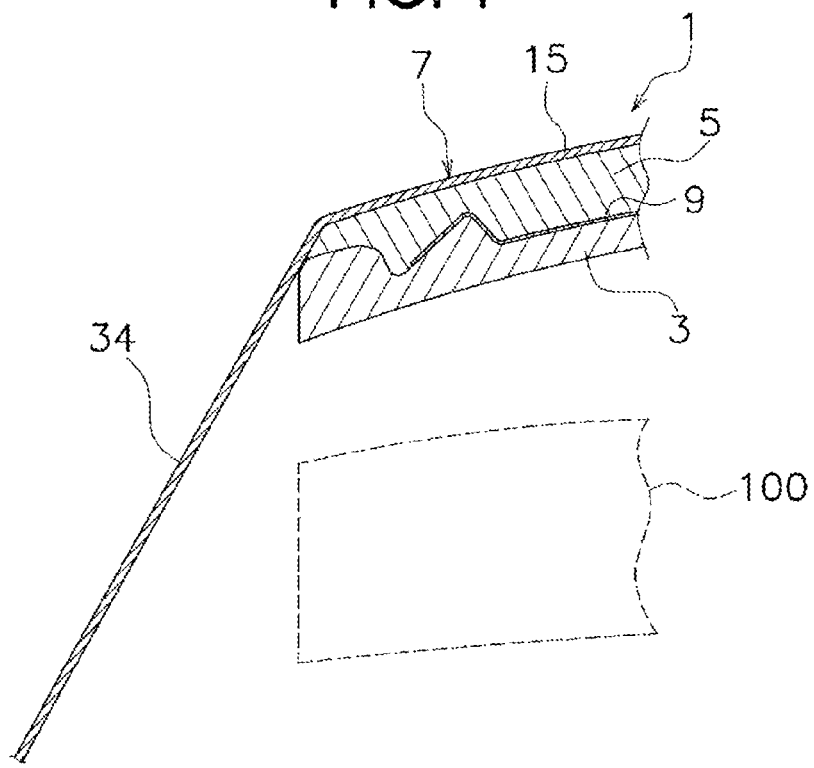
FIG. 2 is a schematic cross-sectional view of the electromagnetic wave transmissive cover and a millimeter wave radar.
Figure 3:
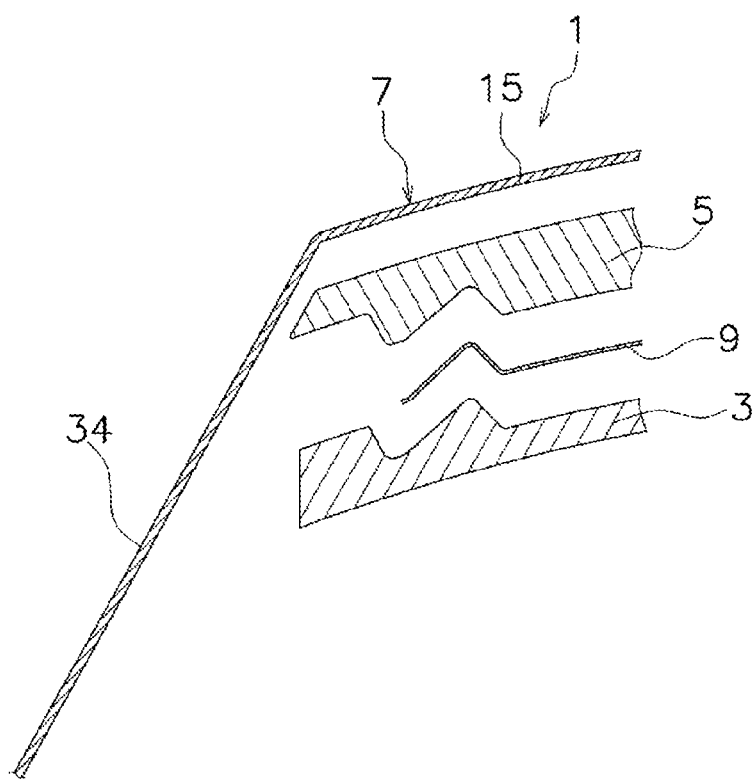
FIG. 3 is an exploded view of FIG. 2.
Figure 4:
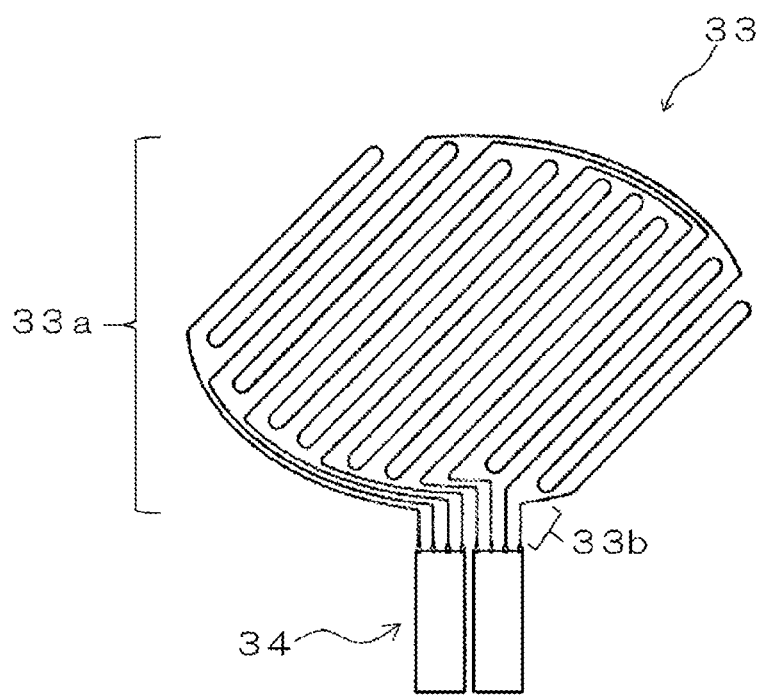
FIG. 4 is a plan view of a wiring pattern of a transparent heater film.
Figure 5:
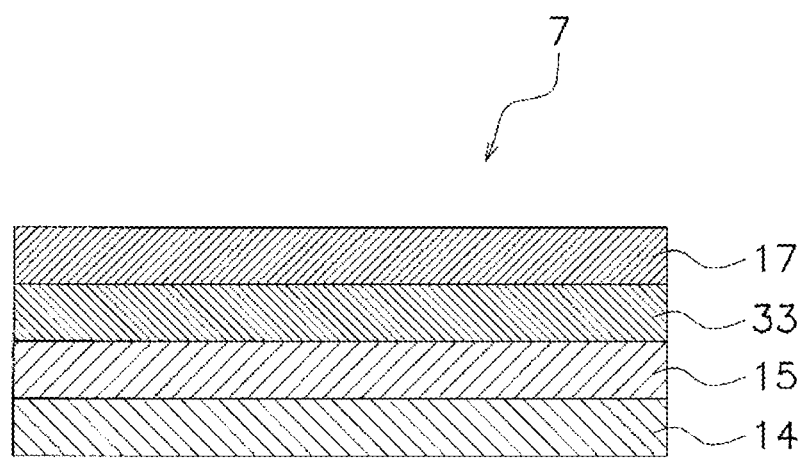
FIG. 5 is a schematic cross-sectional view of the transparent heater film.
Figure 6:
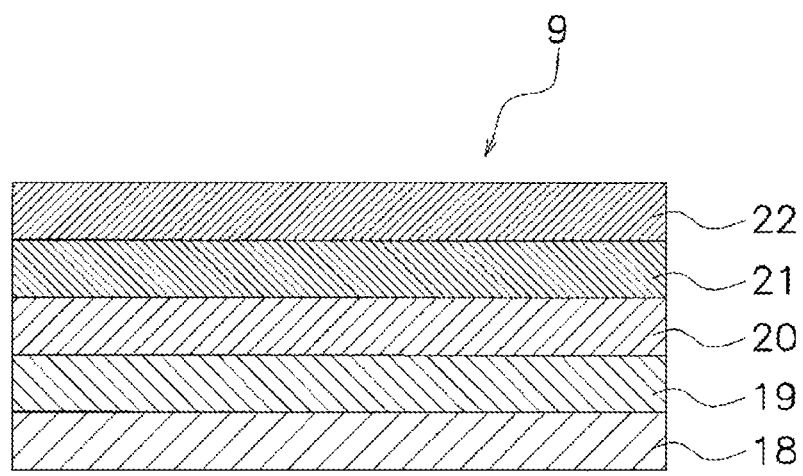
FIG. 6 is a schematic cross-sectional view of a pictorial pattern layer.

An electromagnetic wave transmissive cover 1 according to the first embodiment will be described using FIG. 1 to FIG. 6. FIG. 1 is a schematic plan view of the electromagnetic wave transmissive cover 1 according to the first embodiment. FIG. 2 is a schematic cross-sectional view of the electromagnetic wave transmissive cover 1 and a millimeter wave radar 100. FIG. 3 is an exploded view of FIG. 2. FIG. 4 is a plan view of a wiring pattern 33 of a transparent heater film 7. FIG. 5 is a schematic cross-sectional view of the transparent heater film 7. FIG. 6 is a schematic cross-sectional view of a pictorial pattern layer 9.

The electromagnetic wave transmissive cover 1 is, for example, an emblem to be mounted on a front face of a vehicle. Specifically, as illustrated in FIG. 2, the electromagnetic wave transmissive cover 1 is an emblem arranged on a front side of the millimeter wave radar 100. The millimeter wave radar 100 includes, for example, a transmitter configured to emit a millimeter wave, a receiver configured to receive a reflected wave, an arithmetic unit configured to perform arithmetic processing, and the like. The millimeter wave radar 100 transmits and receives a radio wave that is transmitted through the electromagnetic wave transmissive cover 1, and detects a surrounding condition of the vehicle based on the received radio wave. For example, the millimeter wave radar 100 calculates and outputs a distance to an obstacle, a relative velocity of the obstacle, and the like.

The electromagnetic wave transmissive cover 1 has an elliptical shape in a plan view, and has a long axis extending in a longitudinal direction and a short axis extending in a short-length direction. As an example, the long axis of the electromagnetic wave transmissive cover 1 is 190 mm, and the short axis is 130 mm.

The electromagnetic wave transmissive cover 1 includes a colored resin member 3. The colored resin member 3 is a plate-like member or a plate-like layer having an elliptical shape in a plan view. The colored resin member 3 is, for example, black, and has an uneven shape, that is, a three-dimensional pattern shape.

The colored resin member 3 is made of synthetic resin such as acrylonitrile butadiene styrene (ABS) copolymer synthetic resin, acrylonitrile ethylene styrene (AES) copolymer synthetic resin, acrylonitrile styrene acrylate (ASA), polybutylene terephthalate (PBT), colored polycarbonate (PC), or polyethylene terephthalate (PET), or composite resin thereof, and have a thickness of approximately 0.5 mm to 10 mm.

The electromagnetic wave transmissive cover 1 includes a transparent resin member 5. The transparent resin member 5 is a plate-like member or a plate-like layer having an elliptical shape in a plan view. The transparent resin member 5 is provided on an opposite side to the millimeter wave radar 100 of the colored resin member 3.

A surface opposite to the colored resin member 3 of the transparent resin member 5 is a generally smooth surface. As a result, a thickness of the electromagnetic wave transmissive cover 1 is generally constant by the colored resin member 3 and the transparent resin member 5. Furthermore, the visibility of a design from the exterior of the vehicle is increased.

Note that transparency includes a colored transparent state.

The transparent resin member 5 is formed of transparent synthetic resin such as colorless PC or polymethyl methacrylate (PMMA) resin, for example, and has a thickness of approximately 1.5 mm to 10 mm.

The electromagnetic wave transmissive cover 1 includes the transparent heater film 7. The transparent heater film 7 is provided on the opposite side to the millimeter wave radar 100 of the colored resin member 3, and specifically, is provided on a surface on the opposite side to the colored resin member 3 of the transparent resin member 5. The transparent heater film 7 has electromagnetic wave transmissivity.

As illustrated in FIG. 5, the transparent heater film 7 is configured with a base substrate 15 and each layer formed thereon. Specifically, an adhesive layer 14 is provided on a lower surface of the base substrate 15. Furthermore, the wiring pattern 33 and a cover layer 17 are provided on an upper surface of the base substrate 15.

The base substrate 15 and the cover layer 17 are preferably made of transparent resin, and are made of PC, for example.

The transparent heater film 7 can prevent snow and ice from adhering to a surface of the electromagnetic wave transmissive cover 1. Furthermore, snow and ice adhering to the surface of the electromagnetic wave transmissive cover 1 can be rapidly melted by the transparent heater film 7.

Note that temperature of the transparent heater film 7 may be controlled by a temperature sensor or a control unit (not illustrated).

The electromagnetic wave transmissive cover 1 includes the pictorial pattern layer 9. The pictorial pattern layer 9 is arranged between the colored resin member 3 and the transparent resin member 5. A metal-like design or a design formed by other patterns can be implemented by the pictorial pattern layer 9.

(2) Transparent Heater Film

As illustrated in FIG. 1 to FIG. 3, the base substrate 15 of the transparent heater film 7 has an elliptical shape in a plan view corresponding to the colored resin member 3 and the transparent resin member 5. FPC 34 is connected to a part extending from a main body portion of the base substrate 15.

As illustrated in FIG. 4, the wiring pattern 33 includes a heater portion 33a and wirings 33b extending therefrom. The heater portion 33a is configured of four systems connected in parallel. Specifically, the heater portion 33a has a pattern that diagonally intersects with a short-length direction. However, the pattern of the heater portion 33a may be vertical, horizontal, or diagonal.

For the wiring pattern 33, for example, copper is used as a material and, more specifically, copper plating is used. Using plating improves the accuracy of a copper wiring thickness. As a plating process, electroless plating, electrolytic plating, or both of them can be used. The plating also makes the management of a line width in addition to a film thickness easier. Note that silver may be used as the material of the wiring pattern 33. In addition, when the wiring pattern 33 is formed by copper foil etching, a similar effect can be obtained.

The wiring pattern 33 has a heater wiring width of 50 to 70 μm, a pitch of 4 to 6 mm, and a plating thickness of 10 to 20 μm. Note that blackening treatment is performed after copper plating.

In the present embodiment, copper plating or copper foil etching is employed to form the wiring pattern 33. In these cases, a configuration corresponding to masking is formed by a photolithography method rather than a printing method. As a result, dimensional management beyond the printing method is possible.

Note that, in the printing method of copper paste, unlike the present embodiment, since a line width and a thickness are varied, the variation in resistance value cannot fall within a desired range.

(3) Pictorial Pattern Layer

The pictorial pattern layer 9 will be described using FIG. 6.

The pictorial pattern layer 9 is configured of a base substrate 20 and a plurality of layers formed thereon. Specifically, a vapor deposition design surface layer 19 and a protective layer 18 are provided in this order on a lower surface of the base substrate 20. Furthermore, a clear layer 21 and a pattern layer 22 are provided in this order on an upper surface of the base substrate 20.

The base substrate 20 is made of polyethylene terephthalate (PET) and PC, for example.

The vapor deposition design surface layer 19 is made of indium, for example.

Figure 9:
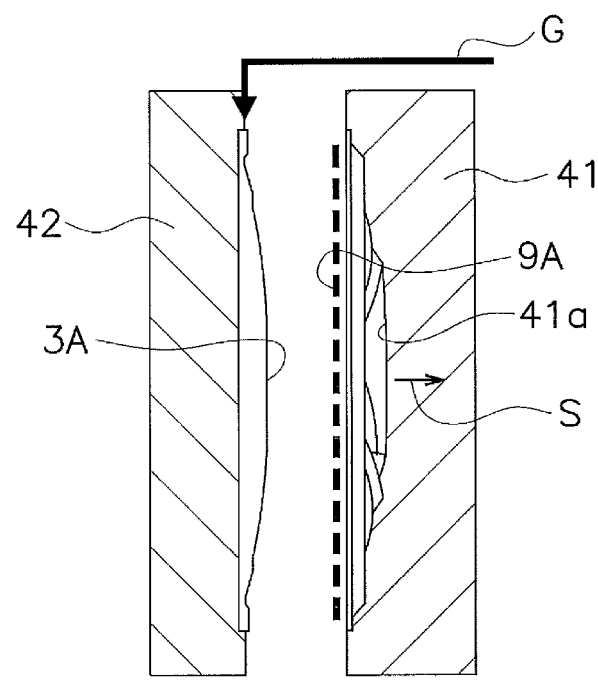
FIG. 9 is a schematic cross-sectional view of a mold in forming a colored resin member.

The protective layer 18 is made of acrylonitrile butadiene styrene (ABS) copolymer synthetic resin, for example. The protective layer 18 protects the vapor deposition design surface layer 19 from injection resin during injection molding for the colored resin member 3 to be described below (FIG. 9).

The clear layer 21 is made of polymethyl methacrylate (PMMA) resin, for example. The clear layer 21 and the base substrate 20, and the protective layer 18 sandwich the vapor deposition design surface layer 19, but the clear layer 21 and the base substrate 20 protect the vapor deposition design surface layer 19 from ink used in the pattern layer 22. However, the clear layer may be omitted.

The pattern layer 22 is a print surface printed by silk screen printing or the like.

Figure 7:
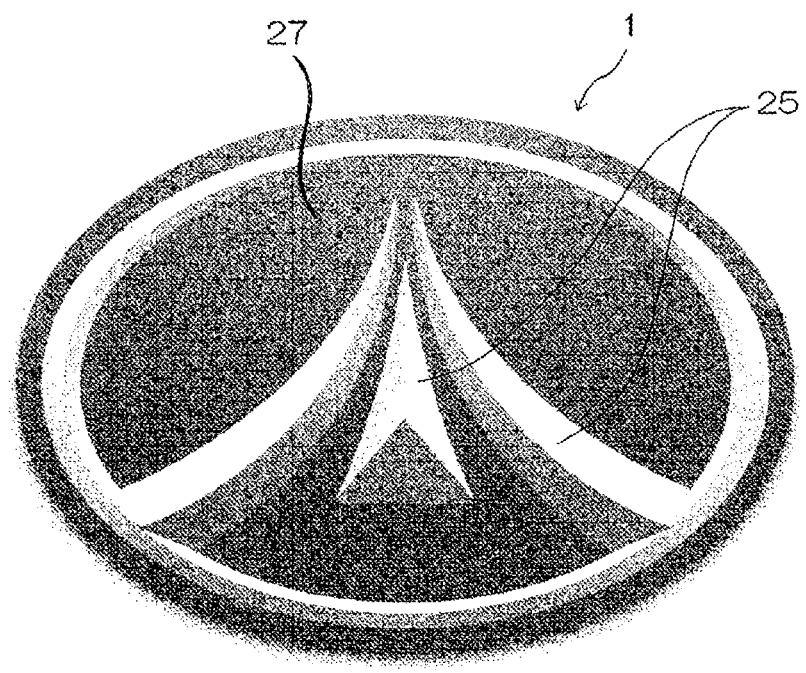
FIG. 7 is a plan view of a first example of the electromagnetic wave transmissive cover.
Figure 8:
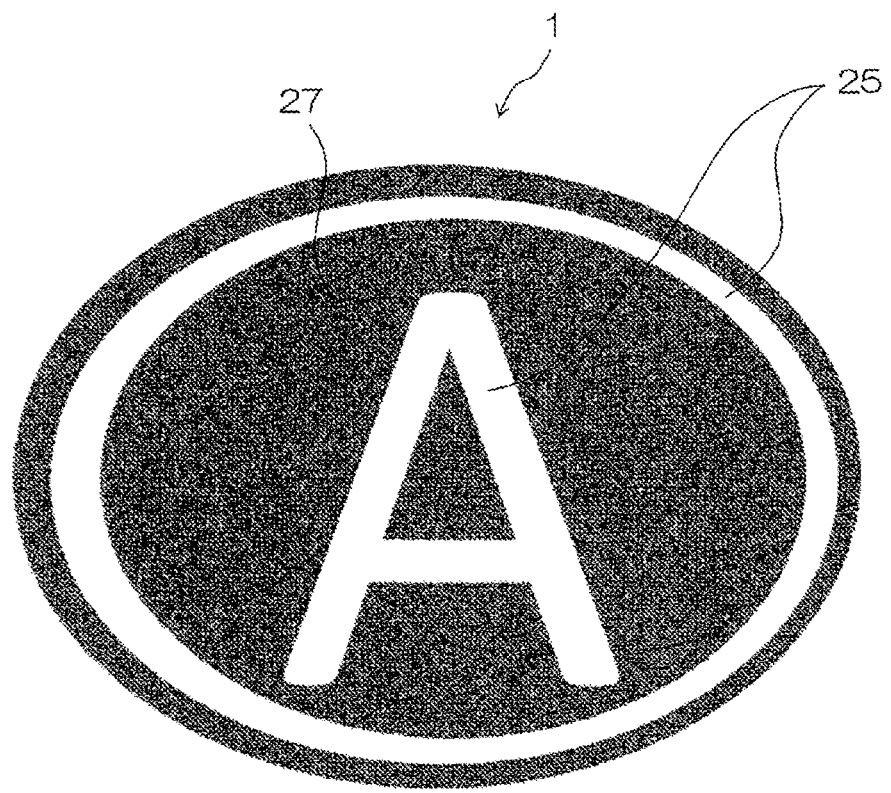
FIG. 8 is a plan view of a second example of the electromagnetic wave transmissive cover.

An example of a pattern of the electromagnetic wave transmissive cover will be described using FIG. 7 and FIG. 8. FIG. 7 is a plan view of a first example of the electromagnetic wave transmissive cover 1. FIG. 8 is a plan view of a second example of the electromagnetic wave transmissive cover 1.

As illustrated in FIG. 7 and FIG. 8, a vapor deposition portion 25 (implemented by the vapor deposition design surface layer 19) and a silk printed portion 27 (implemented by the pattern layer 22) are visible.

(4) Method for Manufacturing Electromagnetic Wave Transmissive Cover

Figure 10:
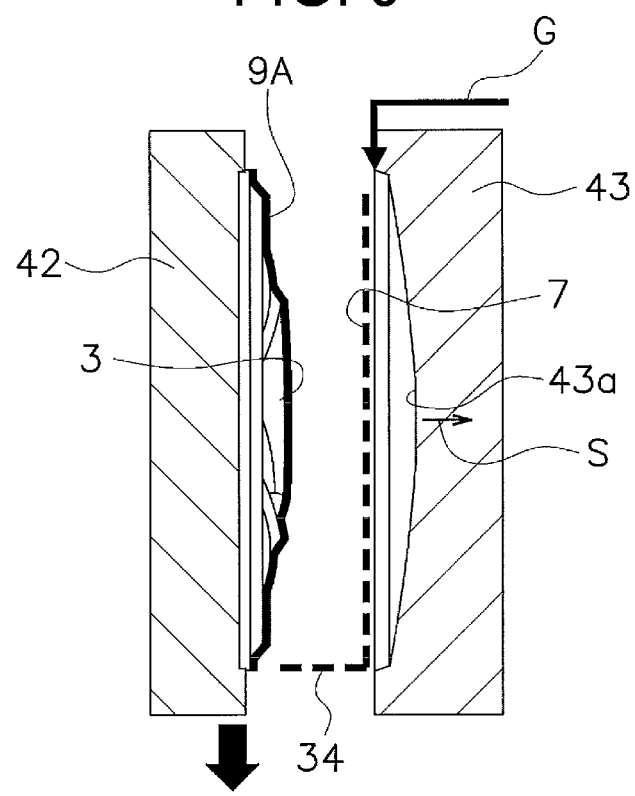
FIG. 10 is a schematic cross-sectional view of a mold in forming a transparent resin member.

Using FIG. 9 and FIG. 10, a method (two-color molding) for manufacturing the electromagnetic wave transmissive cover 1 will be described. FIG. 9 is a schematic cross-sectional view of a mold when the colored resin member 3 is formed. FIG. 10 is a schematic cross-sectional view of a mold when the transparent resin member 5 is formed.

(4-1) Formation of Colored Resin Member

As illustrated in FIG. 9, a first mold 41 and a second mold 42 are used. The first mold 41 is a first fixed mold, and includes a recessed portion 41a on a facing side thereof. The second mold 42 is a movable mold, and a facing side thereof is generally planar.

In a state in which a film 9A serving as the pictorial pattern layer 9 is set in the first mold 41, the second mold 42 is brought close to and clamped with the first mold 41. Thereafter, as indicated by an arrow S, the film 9A is suctioned toward the first mold 41 side. In this state, molten resin 3A is injected from a gate G to the second mold 42 side, so that the film 9A is integrally molded with the colored resin member 3, and a first molding can be obtained.

(4-2) Formation of Transparent Resin Member

As illustrated in FIG. 10, the second mold 42 and a third mold 43 are used. The third mold 43 is a second fixed mold, and includes a recessed portion 43a on a facing side thereof.

With the transparent heater film 7 set in the third mold 43, the second mold 42 on which the first molding is mounted is brought close to and clamped with the third mold 43. Thereafter, as indicated by the arrow S, the transparent heater film 7 is suctioned toward the third mold 43 side. In this state, molten resin is injected from the gate G to the third mold 43 side, thereby integrally molding the transparent heater film 7 with the transparent resin member 5. As a result, the electromagnetic wave transmissive cover 1 is completed as a second molding.

Note that the FPC 34 of the transparent heater film 7 is arranged outside the recessed portion 43a in the operation described above.

(4-3) Detailed Description of Formation of Colored Resin Member

Figure 11:
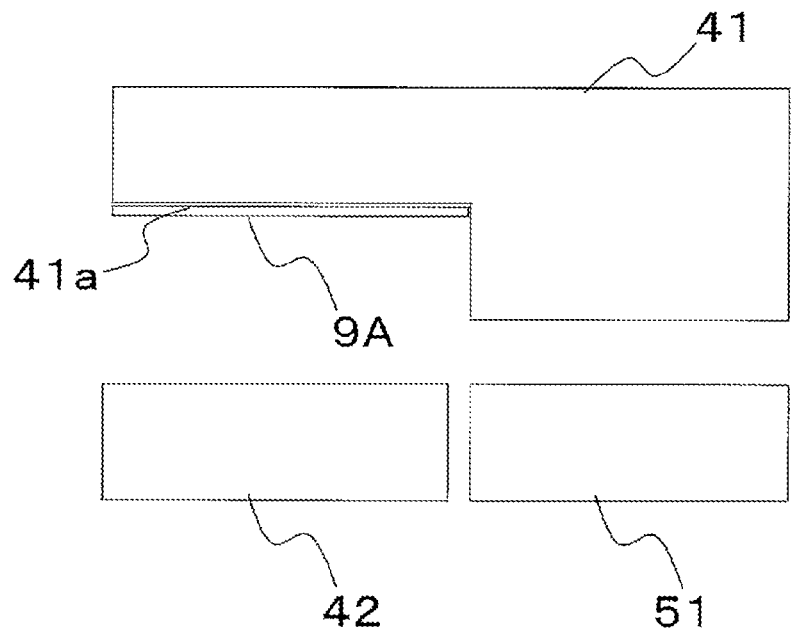
FIG. 11 is a schematic view illustrating a state before clamping in forming the colored resin member.
Figure 12:
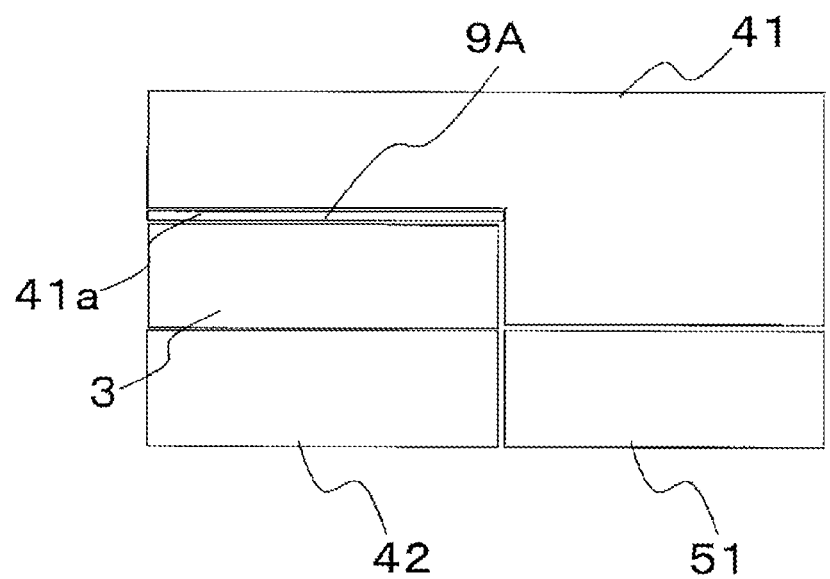
FIG. 12 is a schematic view illustrating a state after clamping and during injection molding in forming the colored resin member.

Formation of the colored resin member will be described in detail using FIG. 11 and FIG. 12. FIG. 11 is a schematic view illustrating a state before clamping in forming the colored resin member 3. FIG. 12 is a schematic view illustrating a state after clamping and during injection molding in forming the colored resin member 3.

As illustrated in FIG. 11, together with the second mold 42, a slide core 51 approaches the first mold 41, so that clamping is performed. Thereafter, as illustrated in FIG. 12, the film 9A is integrally molded with the colored resin member 3 by injection molding.

(4-4) Detailed Description of Formation of Transparent Resin Member

Figure 13:
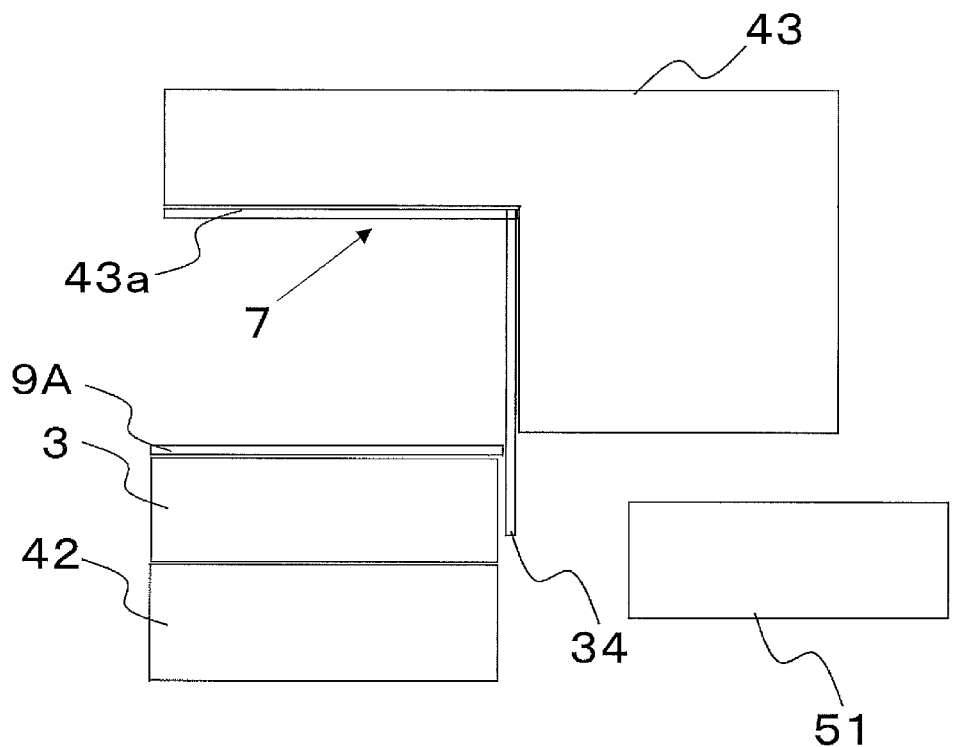
FIG. 13 is a schematic view illustrating a state before clamping in forming the transparent resin member.
Figure 14:
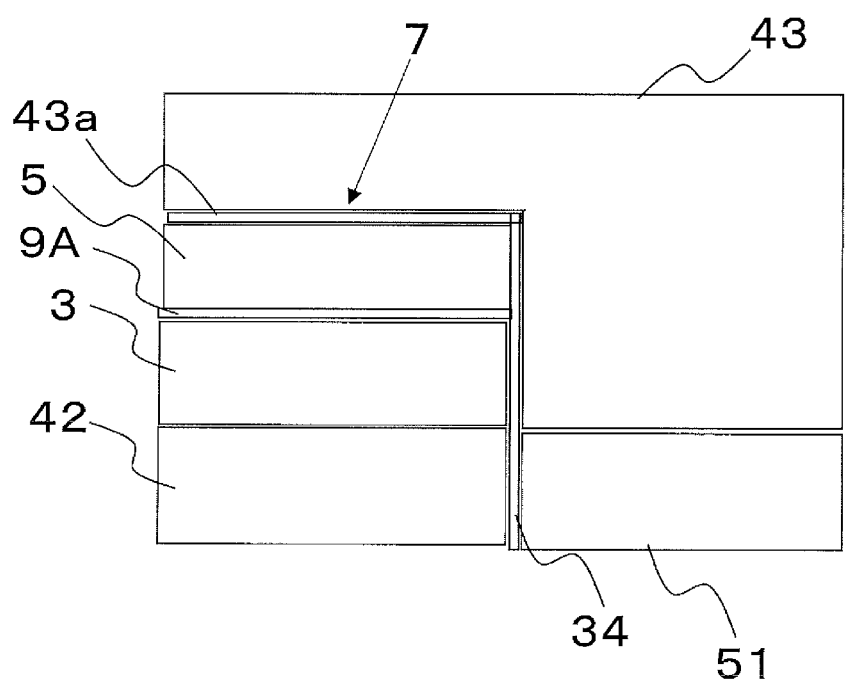
FIG. 14 is a schematic view illustrating a state after clamping and during injection molding in forming the transparent resin member.

Formation of the transparent resin member will be described in detail using FIG. 13 and FIG. 14. FIG. 13 is a schematic view illustrating a state before clamping in forming the transparent resin member 5. FIG. 14 is a schematic view illustrating a state after clamping and during injection molding in forming the transparent resin member 5.

As illustrated in FIG. 13, the transparent heater film 7 is set in the recessed portion 43a of the third mold 43. At this time, the FPC 34 protrudes further from an edge wall surface of the recessed portion 43a. In this state, the second mold 42 on which the colored resin member 3 is mounted approaches the third mold 43 together with the slide core 51, and thus clamping is performed. Thereafter, as illustrated in FIG. 14, the transparent heater film 7 is integrally molded with the transparent resin member 5 by injection molding.

As can be seen in FIG. 14, during clamping and injection molding, the FPC 34 is sandwiched between side wall surfaces of the second mold 42 and the slide core 51. Thus, there is no failure due to the jump-out of the FPC 34.

The FPC 34 can be managed in this manner because the molding of the colored resin member 3 is performed first, and then the transparent heater film 7 is integrally molded with the transparent resin member 5 at the same time as the molding of the transparent resin member 5. In other words, it is not necessary to manage the FPC during the molding of the colored resin member.

2. Second Embodiment

In the first embodiment, the pictorial pattern layer is arranged between the transparent resin member and the colored resin member, and the transparent heater film is provided on an outer surface of the transparent resin member. However, the position of the transparent heater film is not particularly limited.

Figure 15:
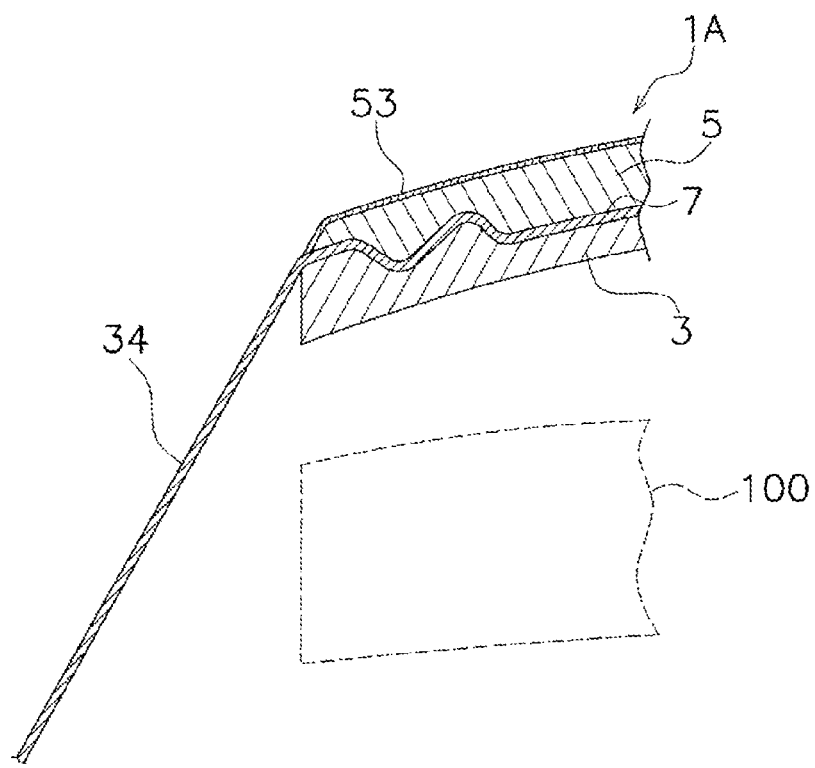
FIG. 15 is a schematic cross-sectional view of an electromagnetic wave transmissive cover and a millimeter wave radar according to a second embodiment.

Using FIG. 15, a second embodiment will be described as an embodiment in which the transparent heater film is provided inside the transparent resin member. FIG. 15 is a schematic cross-sectional view of an electromagnetic wave transmissive cover 1A and the millimeter wave radar 100 according to the second embodiment.

In the electromagnetic wave transmissive cover 1A according to the second embodiment, the pictorial pattern layer is omitted, and the transparent heater film 7 is provided between the transparent resin member 5 and the colored resin member 3.

Furthermore, a hard coat layer 53 is formed on a surface of the transparent resin member 5. Hard coat treatment may be performed instead of the hard coat layer.

3. Third Embodiment

In the first embodiment and the second embodiment, the colored resin member is provided on the entire surface of the transparent resin member, but the colored resin member may be partially provided.

Figure 16:
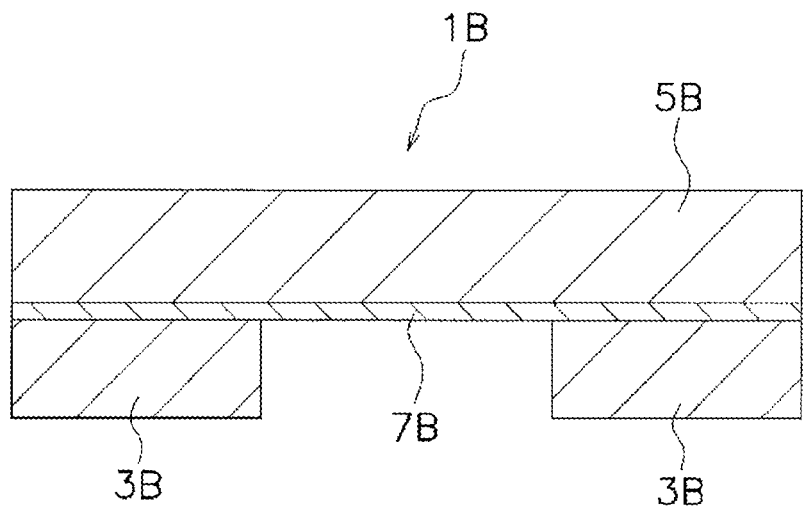
FIG. 16 is a schematic cross-sectional view of an electromagnetic wave transmissive cover according to a third embodiment.

Such an embodiment will be described as a third embodiment by using FIG. 16. FIG. 16 is a schematic cross-sectional view of an electromagnetic wave transmissive cover 1B according to the third embodiment.

In this embodiment, a transparent heater film 7B is provided on the inside of a transparent resin member 5B. As an example, a colored resin member 3B is formed on only an outer circumferential side portion of the transparent resin member 5B.

4. Fourth Embodiment

Figure 17:
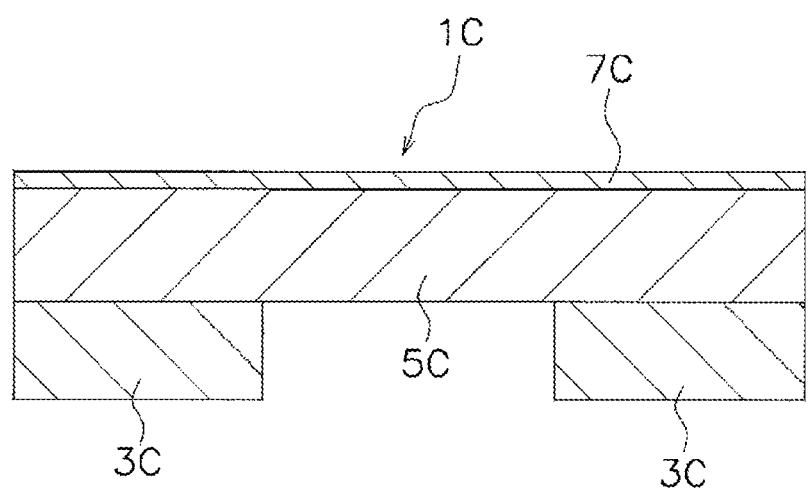
FIG. 17 is a schematic cross-sectional view of an electromagnetic wave transmissive cover according to a fourth embodiment.

A modified example of the third embodiment will be described as a fourth embodiment by using FIG. 17. FIG. 17 is a schematic cross-sectional view of an electromagnetic wave transmissive cover 1C according to the fourth embodiment.

In this embodiment, a transparent heater film 7C is provided on an outer side surface of a transparent resin member 5C. As an example, a colored resin member 3C is formed on only an outer circumferential side portion of the transparent resin member 5C.

5. Features of the Embodiments

The electromagnetic wave transmissive cover 1 (one example of the electromagnetic wave transmissive cover) is a member to be installed in the electromagnetic wave irradiation direction of the millimeter wave radar 100 (one example of the sensor using an electromagnetic wave), and includes the colored resin member 3 (one example of the colored resin member), the transparent resin member 5 (one example of the transparent resin member), and the transparent heater film 7 (one example of the transparent heater film). The transparent resin member 5 is provided on the opposite side to the millimeter wave radar 100 of the colored resin member 3. The transparent heater film 7 is provided on the side opposite to the millimeter wave radar 100 of the colored resin member 3, and has electromagnetic wave transmissivity. In this electromagnetic wave transmissive cover 1, the colored resin member 3 can be viewed through the transparent heater film 7 and the transparent resin member 5, and therefore a deep design can be implemented. Furthermore, snow and ice adhering to the surface can be rapidly melted by the transparent heater film 7.

6. Other Embodiments

Although the plurality of embodiments of the present disclosure have been described as above, the present disclosure is not limited to the above-described embodiments, and various modifications are possible without departing from the gist of the invention. In particular, the plurality of embodiments and modified example which are described in the present specification can be freely combined with one another as needed.

The present disclosure is also applicable to an electromagnetic wave transmissive cover other than emblems.

The electromagnetic wave transmissive cover of the present disclosure can also be applied to a sensor using an electromagnetic wave other than millimeter waves, and can also be applied to, for example, Lidar.

INDUSTRIAL APPLICABILITY

The present disclosure can be broadly applied to an electromagnetic wave transmissive cover to be installed in an electromagnetic wave irradiation direction of a sensor using an electromagnetic wave.

BRIEF DESCRIPTION OF THE REFERENCE NUMERALS

1: Electromagnetic wave transmissive cover
3: Colored resin member
3A: Molten resin
5: Transparent resin member
7: Transparent heater film
9: Pictorial pattern layer
15: Base substrate
33: Wiring pattern
33a: Heater portion
33b: Wiring
34: FPC
100: Millimeter wave radar

The invention claimed is:

1. An electromagnetic wave transmissive cover to be installed on a vehicle in an electromagnetic wave irradiation direction of a sensor using an electromagnetic wave, the electromagnetic wave transmissive cover comprising:
a colored resin member having a first surface with a three-dimensional shape;
a transparent resin member provided on the colored resin member and positioned on a side of the colored resin member opposite to the sensor, wherein the transparent resin member having a second surface with a three-dimensional shape; and
a transparent heater film provided on an outermost surface of the transparent resin member opposite the colored resin member, including a wiring pattern with a wiring width of 50 to 70 μm formed by copper plating or copper foil etching, and having electromagnetic wave transmissivity,
wherein the transparent heater film further includes a cover layer and a base substrate, such that the wiring pattern is provided between an upper surface of the base substrate and a lower surface of the cover layer.

2. The electromagnetic wave transmissive cover according to claim 1, further comprising:
a pictorial pattern layer arranged between the colored resin member and the transparent resin member.

3. The electromagnetic wave transmissive cover according to claim 1, wherein
the electromagnetic wave transmissive cover is an emblem to be mounted on a vehicle, and
the sensor is a millimeter wave radar.

4. A method for manufacturing an electromagnetic wave transmissive cover to be installed on a vehicle in an electromagnetic wave irradiation direction of a sensor using an electromagnetic wave, the method comprising:
forming a wiring pattern having a wiring width of 50 to 70 μm by copper plating or copper foil etching on a base substrate to prepare a transparent heater film;
molding a colored resin member having a first surface with a three-dimensional shape; and
molding a transparent resin member having a second surface with a three-dimensional shape on the first surface of the colored resin member, and integrally molding the transparent heater film having electromagnetic wave transmissivity with the transparent resin member on an outermost surface of the transparent resin member opposite the second surface with the three-dimensional shape,
wherein the transparent heater film further includes a cover layer and the base substrate, such that the wiring pattern is provided between an upper surface of the base substrate and a lower surface of the cover layer.

5. The method of claim 4, further comprising arranging a flexible printed circuit for the transparent heater film after molding the colored resin member.

6. The method of claim 4, wherein molding the colored resin member comprises performing injection molding of the colored resin member using a first mold and a second mold.

7. The method of claim 6, wherein molding the transparent resin member comprises performing injection molding of the transparent resin member using the second mold and a third mold.

8. The method of claim 6, further comprising setting a pictorial pattern layer in the first mold, wherein the pictorial pattern layer is integrally molded with the colored resin member.

9. The electromagnetic wave transmissive cover according to claim 1, wherein the wiring pattern has a pitch of 4 to 6 mm and a plating thickness of 10 to 20 μm.

10. The electromagnetic wave transmissive cover according to claim 1, wherein the wiring pattern includes a heater portion configured to melt snow or ice from the electromagnetic wave transmissive cover.

11. The electromagnetic wave transmissive cover according to claim 10, further comprising a flexible printed circuit connected to the heater portion of the wiring pattern.

12. The electromagnetic wave transmissive cover according to claim 1, wherein the three-dimensional shape of the first surface corresponds to the three-dimensional shape of the second surface.

13. The electromagnetic wave transmissive cover according to claim 12, further comprising a pictorial pattern layer configured to fit between the three-dimensional shape of the first surface and the three-dimensional shape of the second surface.

14. The electromagnetic wave transmissive cover according to claim 2, wherein the pictorial pattern layer includes a base substrate.

15. The electromagnetic wave transmissive cover according to claim 14, wherein the pictorial pattern layer includes a vapor deposition design surface layer and a protective layer provided on a lower surface of the base substrate.

16. The electromagnetic wave transmissive cover according to claim 14, wherein the pictorial pattern layer includes a clear layer and a pattern layer provided on an upper surface of the base substrate.

17. A method for manufacturing an electromagnetic wave transmissive cover to be installed on a vehicle in an electromagnetic wave irradiation direction of a sensor using an electromagnetic wave, the method comprising:
forming a wiring pattern having a wiring width of 50 to 70 μm by copper plating or copper foil etching on a base substrate to prepare a transparent heater film;
performing injection molding of a colored resin member having a first surface a with a three-dimensional shape; and
performing injection molding of a transparent resin member having a second surface with a three-dimensional shape on the colored resin member,
wherein the transparent heater film is set into an injection mold such that the transparent heater film is integrally molded on an outermost surface of the transparent resin member opposite the second surface of the transparent resin member when performing injection molding of the transparent resin member, and wherein the transparent heater film further includes a cover layer and the base substrate, such that the wiring pattern is provided between an upper surface of the base substrate and a lower surface of the cover layer.

18. The electromagnetic wave transmissive cover according to claim 2, wherein the pictorial pattern layer includes a pattern layer base substrate, a pattern layer, and a vapor deposition layer such that the pattern layer is provided on the pattern layer base substrate opposite the vapor deposition layer.

19. The electromagnetic wave transmissive cover according to claim 18, wherein the pictorial pattern layer includes a clear layer provided between the pattern layer and the pattern layer base substrate.

20. An electromagnetic wave transmissive cover to be installed on a vehicle in an electromagnetic wave irradiation direction of a sensor using an electromagnetic wave, the electromagnetic wave transmissive cover comprising:

a colored resin member having a first surface with a three-dimensional shape;

a transparent resin member provided with the color resin member and positioned on a side of the colored resin member opposite to the sensor, wherein the transparent resin member has a second surface with a three-dimensional shape; and a transparent heater film provided between the colored resin member and the transparent resin member, including a wiring pattern with a wiring width of 50 to 70 μm formed by copper plating or copper foil etching, and having electromagnetic wave transmissivity, wherein the transparent heater film further includes a cover layer and a base substrate, such that the wiring pattern is provided between an upper surface of the base substrate and a lower surface of the cover layer.

\* \* \* \* \*